(12) United States Patent
Saito

(10) Patent No.: US 7,754,593 B2
(45) Date of Patent: Jul. 13, 2010

(54) SEMICONDUCTOR DEVICE AND MANUFACTURING METHOD THEREFOR

(75) Inventor: Tomohiro Saito, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 177 days.

(21) Appl. No.: 11/882,621

(22) Filed: Aug. 3, 2007

(65) Prior Publication Data
US 2008/0293226 A1 Nov. 27, 2008

Related U.S. Application Data

(62) Division of application No. 11/137,512, filed on May 26, 2005, now abandoned.

(30) Foreign Application Priority Data
Nov. 12, 2004 (JP) .............................. 2004-328673

(51) Int. Cl.
*H01L 21/3205* (2006.01)
*H01L 21/4763* (2006.01)
(52) U.S. Cl. ...................... 438/585; 438/199; 438/223; 438/227; 257/E21.203
(58) Field of Classification Search ................ 438/585, 438/199–227; 257/407, E21.203
See application file for complete search history.

(56) References Cited

U.S. PATENT DOCUMENTS

| 6,562,718 | B1 * | 5/2003 | Xiang et al. ................ 438/682 |
| 6,872,627 | B2 * | 3/2005 | Chen et al. ................... 438/303 |
| 6,929,992 | B1 * | 8/2005 | Djomehri et al. ............. 438/199 |
| 2002/0061639 | A1 * | 5/2002 | Itonaga ........................ 438/592 |
| 2005/0199963 | A1 | 9/2005 | Aoyama |

FOREIGN PATENT DOCUMENTS

| JP | 2000-058822 | 2/2000 |
| JP | 2005-228868 | 8/2005 |
| JP | 2005-353655 | 12/2005 |

OTHER PUBLICATIONS

Notification of Reason for Rejection issued by the Japanese Patent Office on Nov. 13, 2007, for Japanese Patent Application No. 2004-328673, and English-language translation thereof.

* cited by examiner

*Primary Examiner*—Alexander G Ghyka
*Assistant Examiner*—Abdulfattah Mustapha
(74) *Attorney, Agent, or Firm*—Finnegan, Henderson, Farabow, Garrett & Dunner, L.L.P.

(57) ABSTRACT

A method of manufacturing a semiconductor device comprises forming a gate insulation film on a semiconductor substrate; forming a first gate electrode and a second gate electrode on the gate insulation film; forming a mask material so as to expose an upper surface of the first gate electrode while keeping the second gate electrode covered; etching an upper part of the first gate electrode by using the mask material as a mask; removing the mask material; depositing a metal film on the first gate electrode and the second gate electrode; and siliciding the whole of the first gate electrode and an upper part of the second gate electrode.

12 Claims, 26 Drawing Sheets

41, 45···POLYSILICON LAYER
43···NITROGEN-IMPLANTED LAYER

41 ··· POLYSILICON LAYER
43 ··· NITROGEN-IMPLANTED LAYER
46 ··· SILICIDE LAYER

48···POLYSILICON LAYER
49···AMORPHOUS SILICON LAYER

190···TITANIUM NITRIDE FILM (TiN)

SEMICONDUCTOR DEVICE AND MANUFACTURING METHOD THEREFOR

CROSS-REFERENCE TO RELATED APPLICATION

This application is a division of application Ser. No. 11/137,512, filed May 26, 2005 now abandoned, and is based upon and claims the benefit of priority from the prior Japanese Patent Application No. 2004-328673, filed on Nov. 12, 2004, the entire contents of both of which are incorporated herein by reference.

BACKGROUND OF THE INVENTION

1. Field of the Invention

The present invention relates to a semiconductor device and a method of manufacturing the same.

2. Background Art

Recently, manufacturing both a MOSFET having the whole gate electrode silicided (hereinafter referred to as a full silicide MOSFET) and a MOSFET having only an upper part of the gate electrode silicided (hereinafter referred to as a normal silicide MOSFET) on a same semiconductor substrate is considered.

However, in order to form a full silicide MOSFET and a normal silicide MOSFET on the same substrate, it is necessary to individually form a gate electrode of the full silicide MOSFET and the normal silicide MOSFET, respectively, by using a photolithographic technique and an etching technique. This may degrade the reliability of the gate insulation film or the like.

SUMMARY OF THE INVENTION

A method of manufacturing a semiconductor device according to an embodiment of the present invention comprises forming a gate insulation film on a semiconductor substrate; forming a first gate electrode and a second gate electrode on the gate insulation film; forming a mask material so as to expose an upper surface of the first gate electrode while keeping the second gate electrode covered; etching an upper part of the first gate electrode by using the mask material as a mask; removing the mask material; depositing a metal film on the first gate electrode and the second gate electrode; and siliciding the whole of the first gate electrode and an upper part of the second gate electrode.

A method of manufacturing a semiconductor device according to other embodiment of the present invention comprises forming a gate insulation film on a semiconductor substrate; forming a first gate electrode and a second gate electrode on the gate insulation film; forming a mask material so as to expose an upper surface of the second gate electrode while keeping the first gate electrode covered; forming a silicidation restricting layer inside the second gate electrode, the silicidation restricting layer being less easily silicided than a material of the first and the second gate electrodes; removing the mask material; depositing a metal film on the first gate electrode and the second gate electrode; and siliciding the whole of the first gate electrode and an upper part above the silicidation restricting layer in the second gate electrode.

A method of manufacturing a semiconductor device according to further embodiment of the present invention comprises forming a gate insulation film on a semiconductor substrate; forming a first gate electrode and a second gate electrode on the gate insulation film; forming a mask material so as to expose an upper surface of the first gate electrode while keeping the second gate electrode covered; amorphizing an upper part of the first gate electrode by using the mask material as a mask; removing the mask material; depositing a metal film on the first gate electrode and the second gate electrode; and siliciding the whole of the first gate electrode and an upper part of the second gate electrode.

A method of manufacturing a semiconductor device according to further embodiment of the present invention comprises forming a gate insulation film on a semiconductor substrate; depositing a gate electrode material on the gate insulation film; depositing a silicidation restricting material on the gate electrode material, the silicidation restricting material being less easily silicided than the gate electrode material; forming a first gate electrode and a second gate electrode, which have the silicidation restricting material on the upper surfaces thereof, on the gate insulation film by patterning the silicidation restricting material and the gate electrode material; forming a mask material on the silicidation restricting material on the upper surfaces of the first and the second gate electrodes; patterning the mask material so as to expose an upper surface of the silicidation restricting material on the first gate electrode while keeping the silicidation restricting material on the second gate electrode covered; removing the silicidation restricting material on the first gate electrode by using the mask material as a mask; removing the mask material; depositing a metal film on the first gate electrode and the second gate electrode; and siliciding the first gate electrode.

A method of manufacturing a semiconductor device according to further embodiment of the present invention comprises forming a gate insulation film on a semiconductor substrate; forming a first gate electrode and a second gate electrode on the gate insulation film; depositing a metal film on the first gate electrode and the second gate electrode; depositing a heat shielding film on the metal film; patterning the heat shielding film so as to expose the metal film on the first gate electrode while keeping the metal film on the second gate electrode covered; and siliciding the whole of the first gate electrode and an upper part of the second gate electrode.

A method of manufacturing a semiconductor device according to further embodiment of the present invention comprises forming a gate insulation film on a semiconductor substrate; depositing a gate electrode material on the gate insulation film; depositing a cap material covering the gate electrode material; forming a first gate electrode and a second gate electrode, which have the cap material on the upper surfaces thereof, on the gate insulation film by patterning the cap material and the gate electrode material; forming a sidewall film on sidewalls of the first and the second gate electrodes and the cap material; forming trenches on the first and the second gate electrodes by removing the cap material; forming a mask material so as to expose an upper surface of the first gate electrode while keeping the second gate electrode covered; etching the upper part of the first gate electrode by using the mask material as a mask; removing the mask material; filling a metal material in the trenches on the first and the second gate electrodes; siliciding the whole of the first gate electrode and an upper part of the second gate electrode.

A semiconductor device according to an embodiment of the present invention comprises a semiconductor substrate; a gate insulation film provided on the semiconductor substrate; a first gate electrode provided on the gate insulation film and used for a core circuit part of the semiconductor device, the first gate electrode being wholly silicided; and a second gate electrode provided on the gate insulation film and used for a peripheral circuit part of the semiconductor device, the second gate electrode having a laminated structure including a polysilicon layer and a silicide layer.

DETAILED DESCRIPTION OF THE INVENTION

Hereafter, embodiments of the present invention will be described in detail with reference to the drawings. Note that the invention is not limited to the embodiments.

First Embodiment

FIG. 1 to FIG. 4 are cross-sectional diagrams showing a flow of a method of manufacturing a semiconductor device according to a first embodiment of the present invention. For convenience sake, these diagrams show one full silicide MOSFET and one normal silicide MOSFET, respectively. In actual practice, many full silicide MOSFETs and many normal silicide MOSFETs are formed on a silicon substrate. For example, it is considered to employ a full silicide MOSFET for a core circuit part of a semiconductor device and employ a normal silicide MOSFET for a peripheral circuit part. As a result, since a leak current through the gate insulation film decreases, the semiconductor device possesses higher reliability. A full silicide MOSFET may be employed for a logic part of a semiconductor device and a normal silicide MOSFET may be employed for an analog part. As a result, since threshold voltages of the transistors become lower, the operation speed of the semiconductor device increases.

Figure 1:
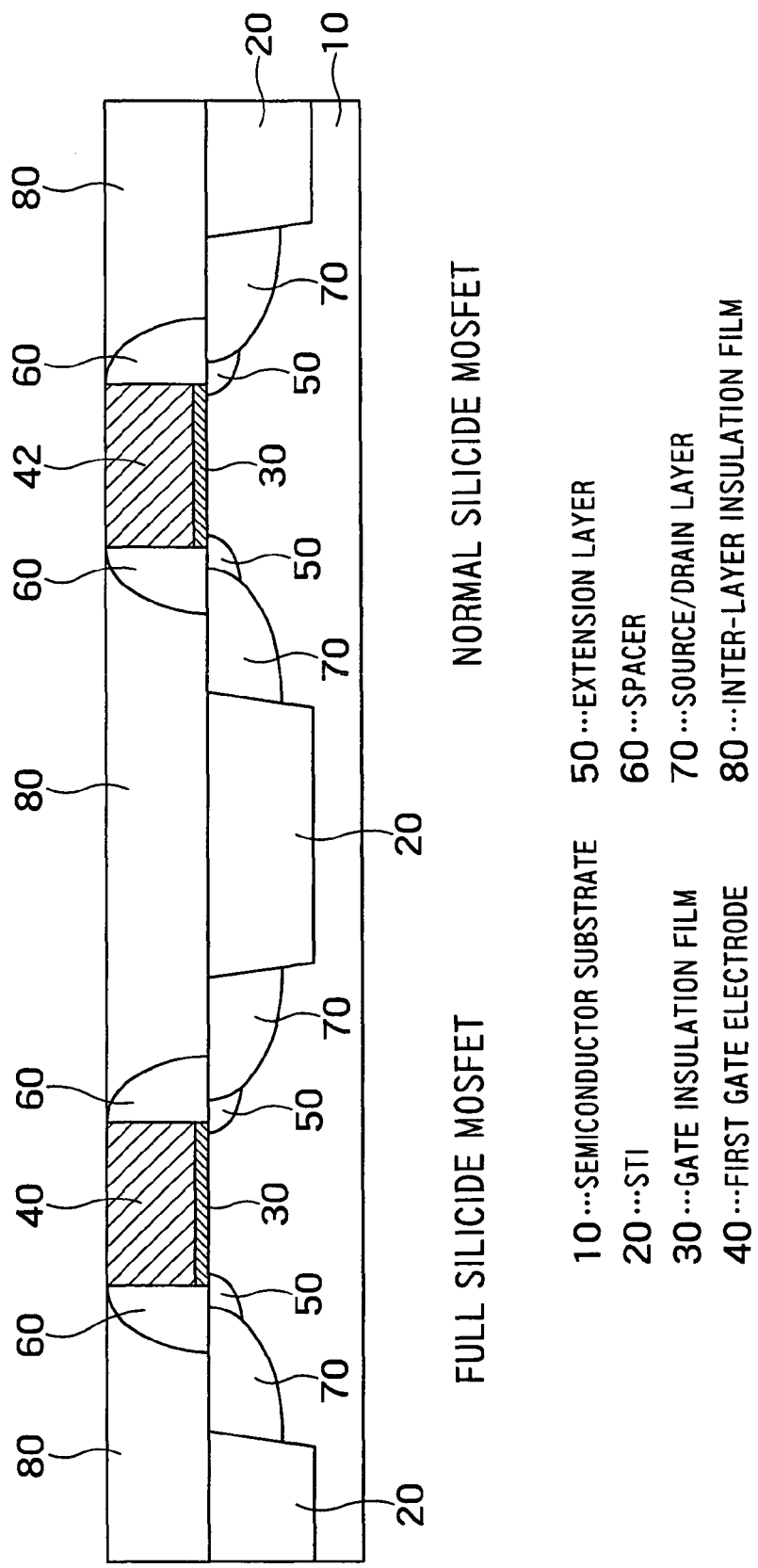
FIG. 1 is a cross-sectional diagram showing a method of manufacturing a semiconductor device according to a first embodiment of the present invention.

As shown in FIG. 1, an element isolation region STI (shallow trench isolation) 20 is first formed on a silicon substrate 10 as a semiconductor substrate. For example, a silicon oxide film and a silicon nitride film (not shown) are deposited on the silicon substrate 10. Next, the silicon nitride film is patterned using a photolithographic technique and an RIE (reactive ion etching) method, or the like. The silicon oxide film and the silicon substrate 10 are etched to a predetermined depth using the patterned silicon nitride film as a mask, thereby forming a trench. Then, a silicon oxide film is deposited on the surface of the silicon substrate 10, thereby filling the silicon oxide film within the trench. This silicon oxide film is flattened according to CMP (chemical mechanical polishing) or the like. The silicon nitride film is removed to complete the shallow trench isolation 20.

Next, a gate insulation film 30 is formed on the surface of the silicon substrate 10. For example, the silicon substrate 10 is thermally oxidized to form a thermally-oxidized film on the surface of the silicon substrate 10. The gate insulation film 30 may be an oxinitride film or a nitride film that is formed by further nitriding the thermally-oxidized film. Alternatively, the gate insulation film 30 may be a high dielectric film such as a hafnium oxide film or a hafnium silicate film. The thickness of the gate insulation film 30 is equal to or smaller than 3 nm, for example.

Next, a first gage electrode 40 and a second gate electrode 42 made of polysilicon are formed on the gate insulation film 30. For example, polysilicon is deposited on the gate insulation film 30. The thickness of the polysilicon is 100 nm, for example. This polysilicon is formed in a gate pattern using a photolithographic technique and anisotropic etching such as RIE. As a result, the first and the second gate electrodes 40 and 42 are formed, respectively. In place of polysilicon, amorphous silicon can be used for the material of the first and the second gate electrodes 40 and 42.

Next, ion implantation is carried out to form an extension (LDD (lightly doped drain)) layer 50. Next, a spacer 60 is formed on a sidewall of the first and the second gate electrodes 40 and 42, respectively, and ion implantation is carried out to form a source/drain layer 70. Annealing is carried out to recover from damage of the silicon substrate 10 due to the ion implantation and to activate impurity. As a result, the extension layer 50 and the source/drain layer 70 are formed. An inter-layer insulation film 80 such as a silicon oxide film is deposited on the surface, and this inter-layer insulation film 80 is flattened by using CMP or the like. In this case, the inter-layer insulation film 80 is ground until when the upper surfaces of the first and the second gate electrodes 40 and 42 are exposed.

Figure 2:
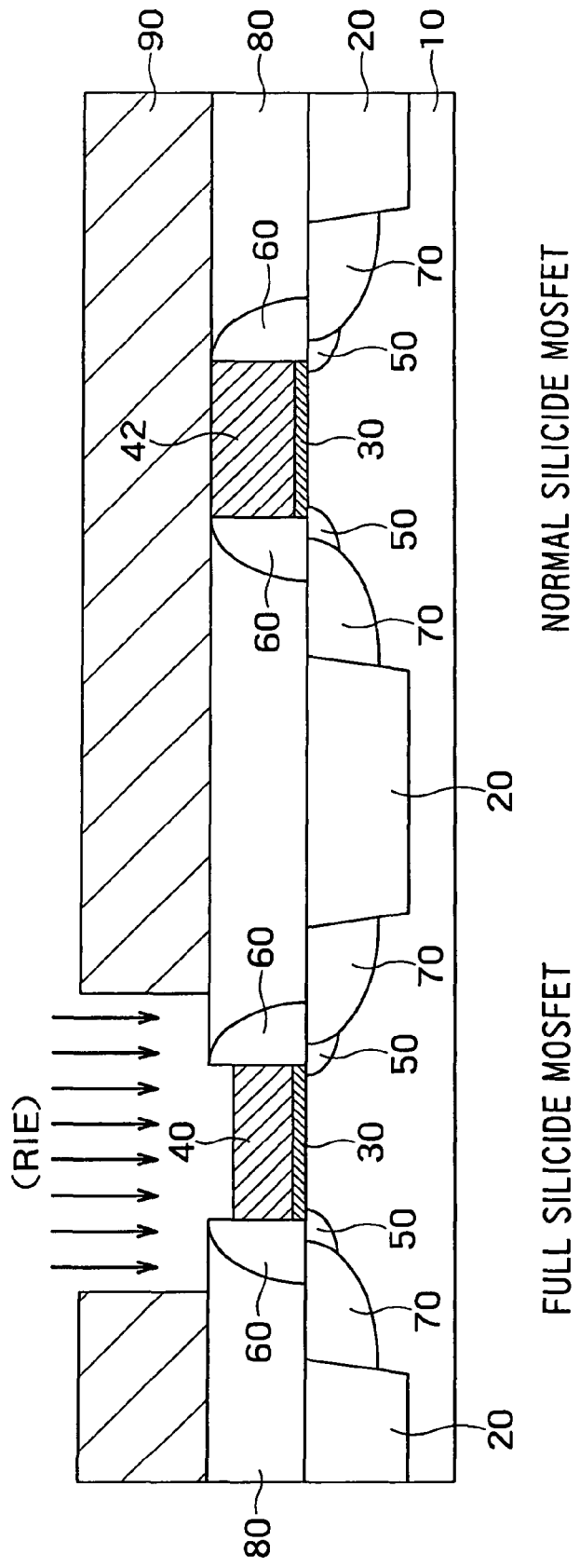
FIG. 2 is a cross-sectional diagram showing a method of manufacturing a semiconductor device following FIG. 1.

A photoresist 90 is coated as a mask material on the first and the second gate electrodes 40 and 42, respectively. As shown in FIG. 2, the photoresist 90 is patterned to expose the upper surface of the first gate electrode 40 while keeping the second gate electrode 42 covered with the photoresist 90. The first gate electrode 40 is etched according to RIE or the like by using the photoresist 90 as a mask. As a result, the thickness of the first gate electrode 40 becomes smaller than that of the second gate electrode 42. For example, the thickness of the first gate electrode 40 is 50 nm to 70 nm, and the thickness of the second gate electrode 42 is 100 nm.

Figure 3:
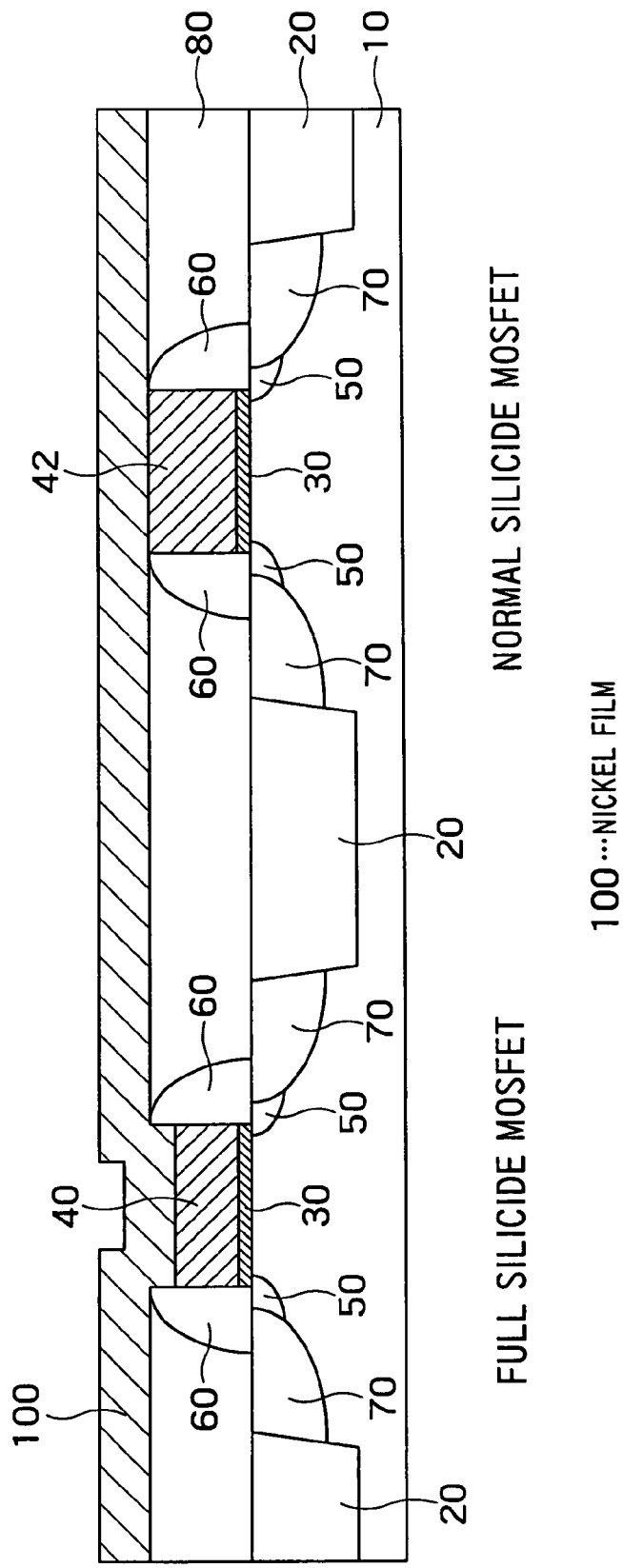
FIG. 3 is a cross-sectional diagram showing a method of manufacturing a semiconductor device following FIG. 2.
Figure 4:
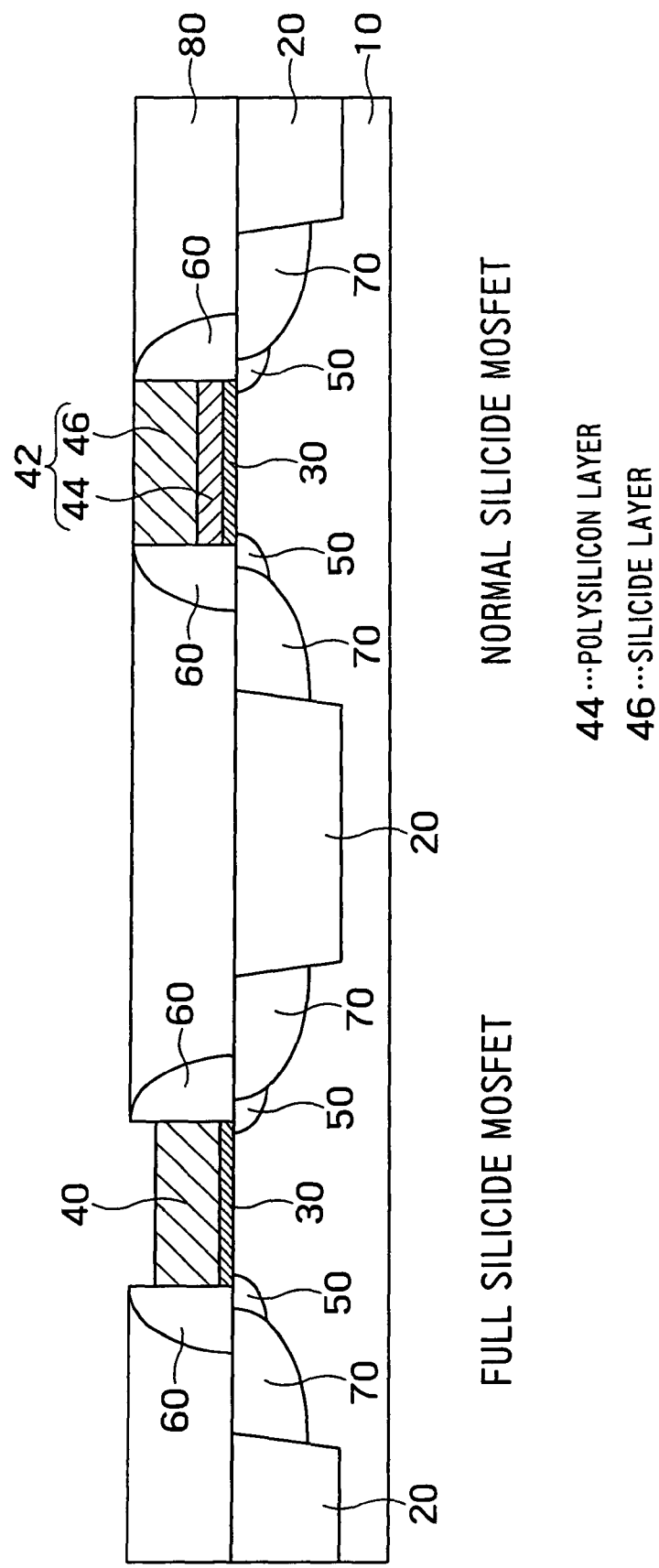
FIG. 4 is a cross-sectional diagram showing a method of manufacturing a semiconductor device following FIG. 3.

The photoresist 90 is removed, and the surface is pre-cleaned. Next, as shown in FIG. 3, a nickel film 100 is deposited as a silicide metal film. The thickness of the nickel film 100 is 50 nm to 70 nm, for example. The first and the second gate electrodes 40 and 42, respectively, react with the nickel film 100 in an annealing process of about 500° C. As a result, nickel silicide is formed as a gate electrode. As shown in FIG. 4, since the height of the first gate electrode 40 is relatively small, the whole of the first gate electrode 40 is silicided. On the other hand, since the height of the second gate electrode 42 is relatively large, only the upper part of the second gate electrode 42 is silicided. As a result, the second gate electrode 42 has a polysilicon layer 44 on the gate insulation film 30, and has a silicide layer 46 on the polysilicon layer 44. In this way, the first gate electrode 40 is fully silicided, and the second gate electrode 42 has a two-layer configuration including the polysilicon layer 44 and the silicide layer 46.

The subsequent manufacturing process is the same as a normal transistor forming process. For example, after an oxide film (not shown) is deposited as an inter-layer film, a contact and wiring (not shown) are formed. As a result, a semiconductor device is completed.

The semiconductor device formed according to the first embodiment includes the semiconductor substrate 10, the gate insulation film 30, the first gate electrode 40, and the second gate electrode 42. The gate insulation film 30 is formed on the semiconductor substrate 10. The first gate electrode 40 is formed on the gate insulation film 30, and is made of silicide in total. The second gate electrode 42 is formed on the gate insulation film 30, and has the polysilicon layer 44 and the silicide layer 46 in lamination. The film thickness of the first gate electrode 40 is formed smaller than that of the second gate electrode 42.

Advantages of the present embodiment are explained. According to a conventional manufacturing method, after a polysilicon electrode is formed, polysilicon present in the region of forming a metal gate is once removed. A metal electrode is formed again in this region. Therefore, reliability of the gate insulation film is lowered.

However, according to the first embodiment, polysilicon that is present in the gate region of the full silicide MOSFET can be fully silicided, or can be changed into a metal gate, without removing this polysilicon. Therefore, according to the first embodiment, reliability of the gate insulation film 30 is not degraded. In other words, according to the present embodiment, a full silicide MOSFET and a normal silicide MOSFET having high reliability can be formed on the same substrate.

According to the conventional method, it is necessary to form a gate electrode twice to form both a full silicide MOSFET and a normal silicide MOSFET on the same substrate, as described above. However, according to the first embodiment, it is sufficient to form a gate electrode only once. As a result, both a full silicide MOSFET and a normal silicide MOSFET can be formed on the same substrate in an easier method than that conventionally used.

The words of "full silicide" and "fully silicide" mean that it is not necessary to silicide full of the gate electrode absolutely, but it is sufficient to silicide the gate electrode substantially from the top surface to the bottom surface of the gate electrode.

(Modifications of the First Embodiment)

Figure 5:
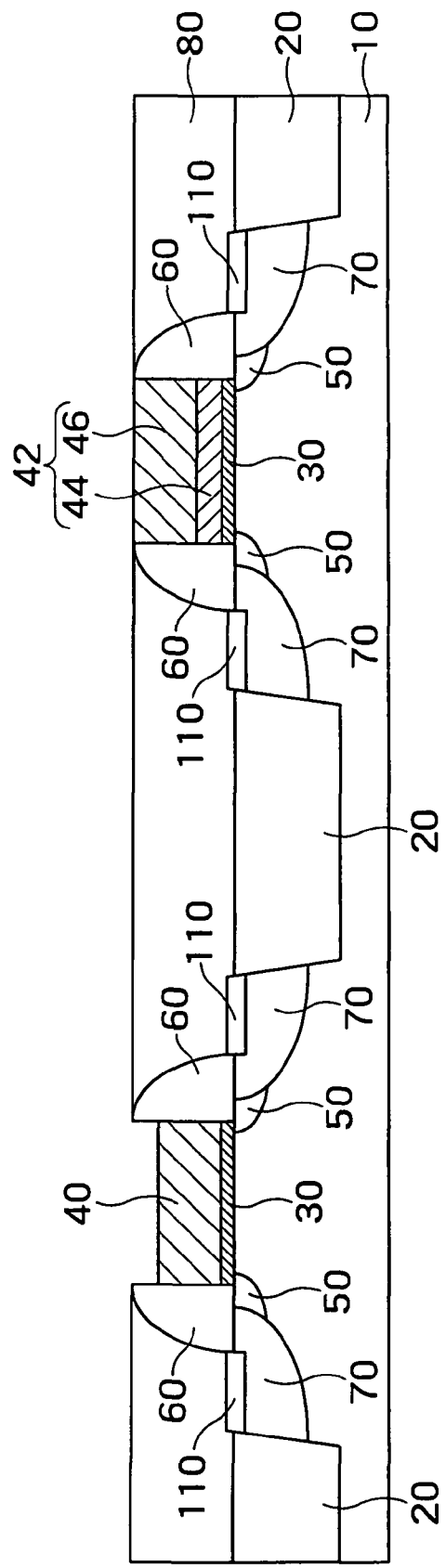
FIG. 5 is a cross-sectional diagram showing a modification of the first embodiment.

According to a modification of the first embodiment, a silicide layer 110 is also formed on the source/drain layer 70, as shown in FIG. 5. In this case, silicide can be formed on the source/drain layer 70, the first gate electrode 40, and the second gate electrode 42, in the same process. Alternatively, the first and the second gate electrodes 40 and 42 may be covered with a mask material, and the silicide layer 110 is formed on the source/drain layer 70. After that, the inter-layer insulation film 80 is flattened to expose the upper surfaces of the first and the second gate electrodes 40 and 42, and silicide is formed on both the first and the second gate electrodes 40 and 42.

Figure 6:
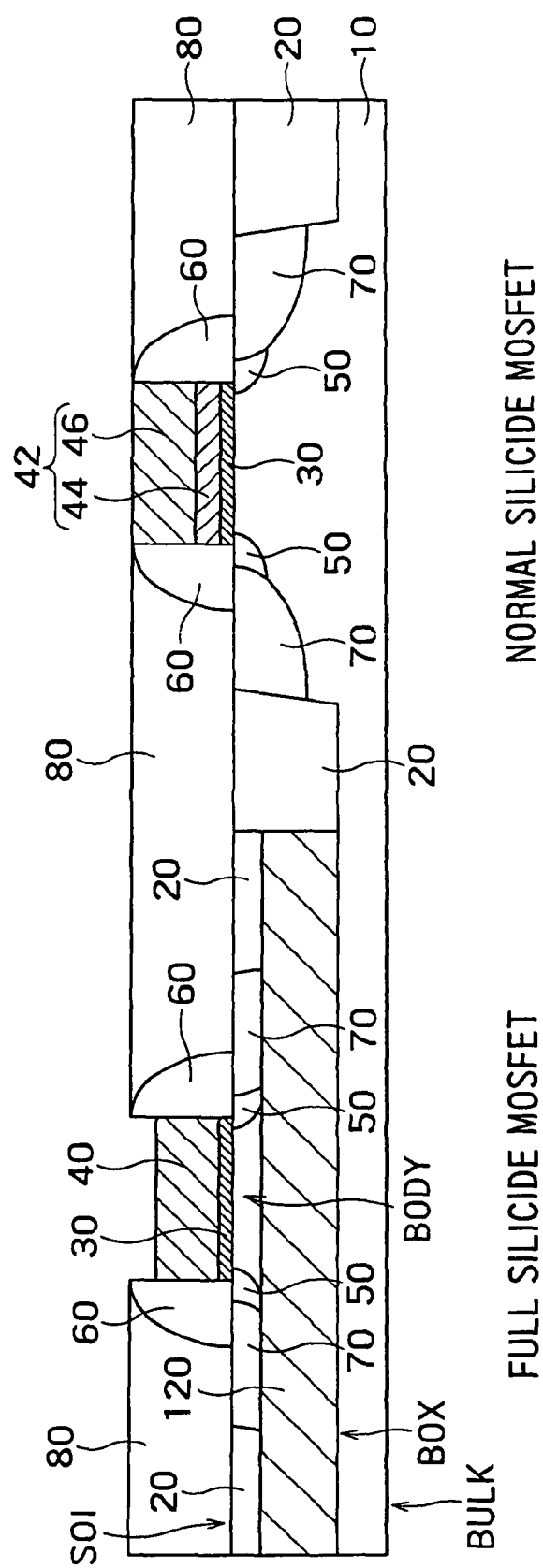
FIG. 6 is a cross-sectional diagram showing other modification of the first embodiment.

According to another modification of the first embodiment, a semiconductor substrate is an SOI (silicon-on-insulator) substrate, as shown in FIG. 6. Particularly, according to this modification, a partial SOI substrate is used for the semiconductor substrate. For example, a full silicide MOSFET can be formed on an SOI region, and a normal silicide MOSFET can be formed on a bulk substrate.

A work function of a metal gate electrode made of nickel silicide is near an intermediate of a silicon band gap. Therefore, when a full silicide MOSFET is formed on a bulk substrate, there is a possibility that a threshold voltage becomes high. However, if a full silicide MOSFET is made a fully depletion type (FD type) transistor by forming the full silicide MOSFET on the SOI, the threshold voltage can be lowered. Therefore, when a full silicide MOSFET is formed in the SOI region and a normal silicide MOSFET is formed on other bulk substrate, the threshold voltages of both of them can be adjusted properly.

Figure 7:
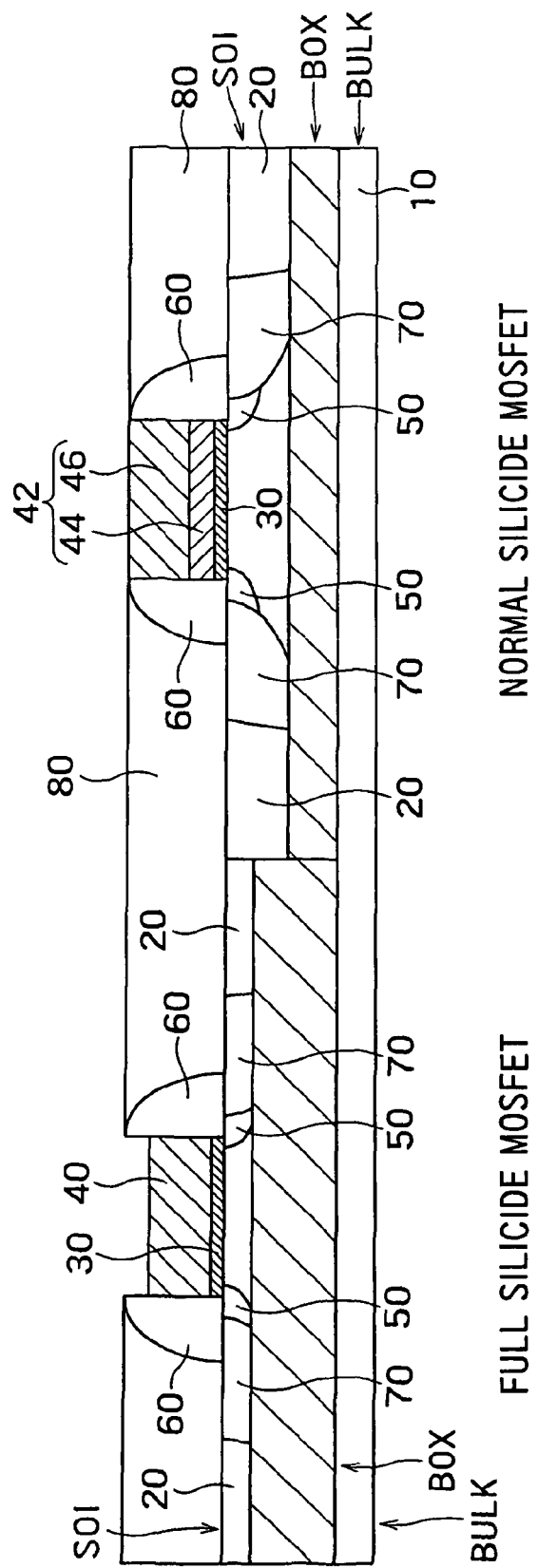
FIG. 7 is a cross-sectional diagram showing a further modification of the first embodiment.

Further, as shown in FIG. 7, both a full silicide MOSFET and a normal silicide MOSFET may be formed on the SOI substrate. In this case, the thickness of the SOI and the thickness of a BOX in the full silicide MOSFET formation region can be different from the thickness of the SOI and the thickness of a BOX in the normal silicide MOSFET formation region, respectively. With this arrangement, the full silicide MOSFET can be made a fully-depletion type (FD type) transistor, and the normal silicide MOSFET can be made a partially-depletion type (FD type) transistor.

Second Embodiment

Figure 8:
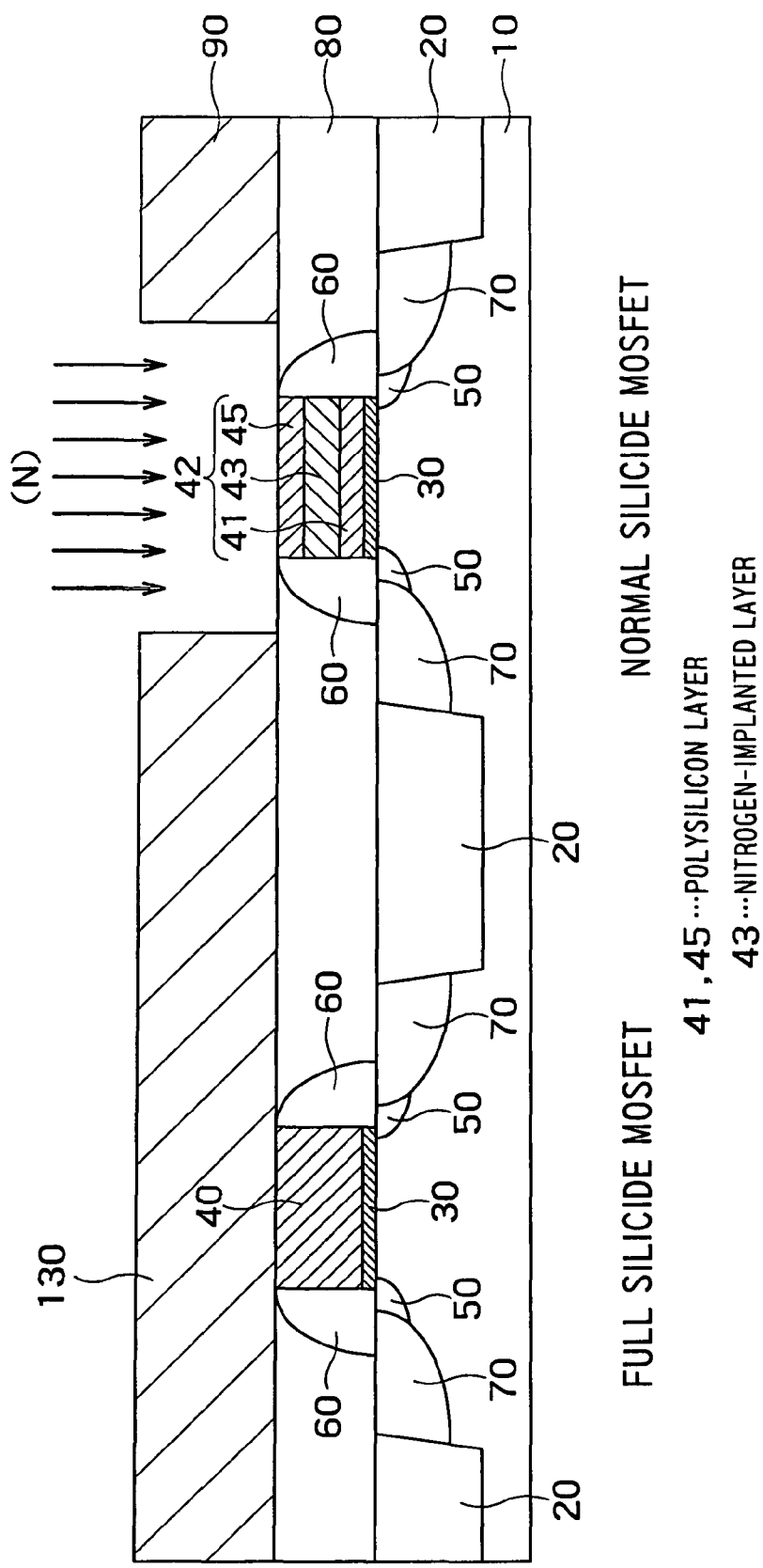
FIG. 8 is a cross-sectional diagram showing a method of manufacturing a semiconductor device according to a second embodiment of the present invention.
Figure 9:
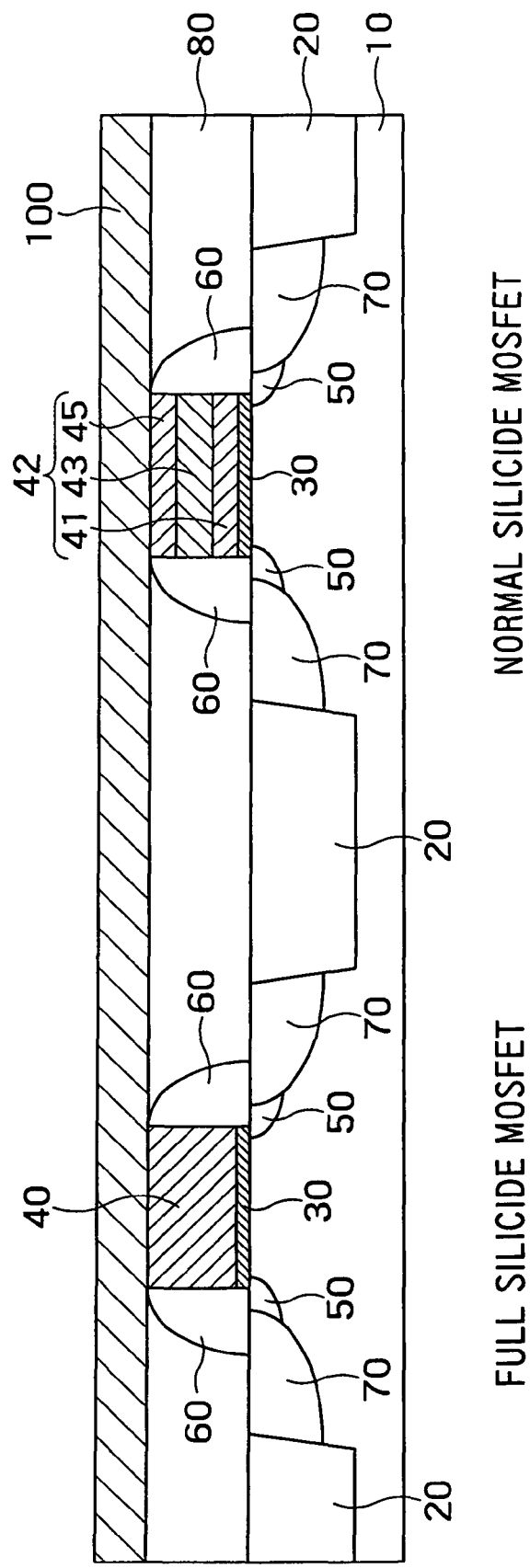
FIG. 9 is a cross-sectional diagram showing a method of manufacturing a semiconductor device following FIG. 8.
Figure 10:
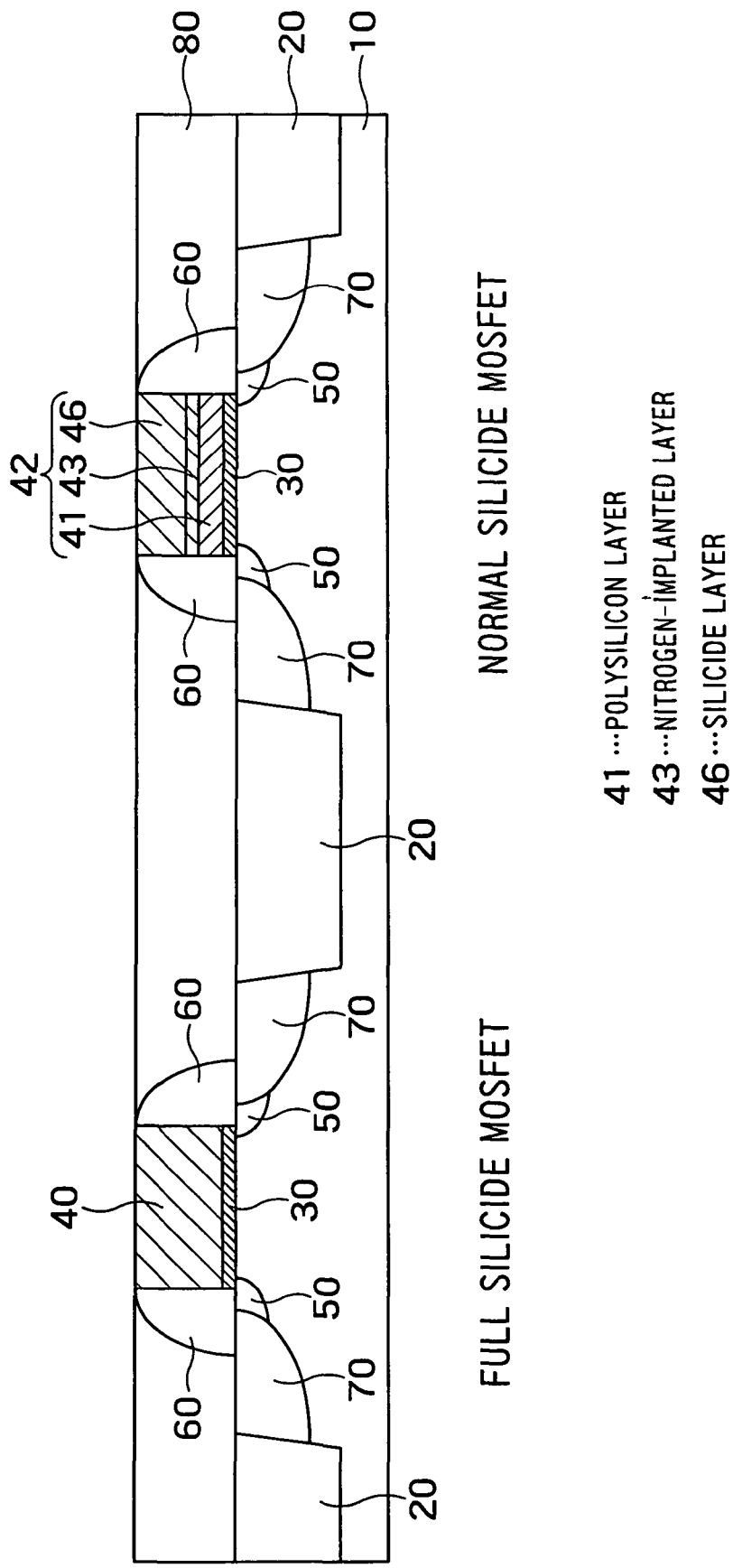
FIG. 10 is a cross-sectional diagram showing a method of manufacturing a semiconductor device following FIG. 9.

FIG. 8 to FIG. 10 are cross-sectional diagrams showing a flow of a method of manufacturing a semiconductor device according to a second embodiment of the present invention. First, the configuration as shown in FIG. 1 is obtained in a process similar to that according to the first embodiment. Next, the photoresist 90 is coated as a mask material on the first and the second gate electrodes 40 and 42. As shown in FIG. 8, the photoresist 90 is patterned to expose the upper surface of the second gate electrode 42 while keeping the first gate electrode 40 covered with the photoresist 90. Nitrogen ions are implanted into the second gate electrode 42 using the photoresist 90 as a mask, for example. As a result, a nitrogen-implanted layer 43 that is less easily silicided than polysilicon is formed as a silicidation restricting layer inside the second gate electrode 42. The nitrogen-implanted layer 43 is provided between the polysilicon layer 41 and the polysilicon layer 45. As explained above, the second gate electrode 42 has a three-layer configuration including the polysilicon layer 41, the nitrogen-implanted layer 43, and the polysilicon layer 45.

After the photoresist 90 is removed, the nickel film 100 is deposited as a metal film, as shown in FIG. 9. The first and the second gate electrodes 40 and 42 are reacted with the nickel film 100 in an annealing process, thereby forming nickel silicide as a gate electrode, as shown in FIG. 10. In this process, in the second gate electrode 42, the polysilicon layer 45 and a part of the nitrogen-implanted layer 43 are silicided, but the polysilicon layer 41 is not silicided. This is because the nitrogen-implanted layer 43 is less easily silicided than the polysilicon layers 41 and 45. On the other hand, since the whole of the first gate electrode 40 is made of polysilicon, the first gate electrode 40 is fully silicided. Thereafter, a semiconductor device is completed in a process similar to that according to the first embodiment.

The semiconductor device according to the second embodiment has effect similar to that according to the first embodiment.

(Modification of the Second Embodiment)

According to a modification of the second embodiment, a silicide layer (not shown) can be formed on the source/drain layer 70 (refer to FIG. 5). In this case, the first and the second gate electrodes 40 and 42 are covered with a mask material, and the silicide layer 110 is formed on the source/drain layer 70. After that, the inter-layer insulation film 80 is flattened to expose the upper surfaces of the first and the second gate electrodes 40 and 42. The first gate electrode 40 is covered by a mask material, and nitrogen ion is implanted into the second gate electrodes 42.

Third Embodiment

Figure 11:
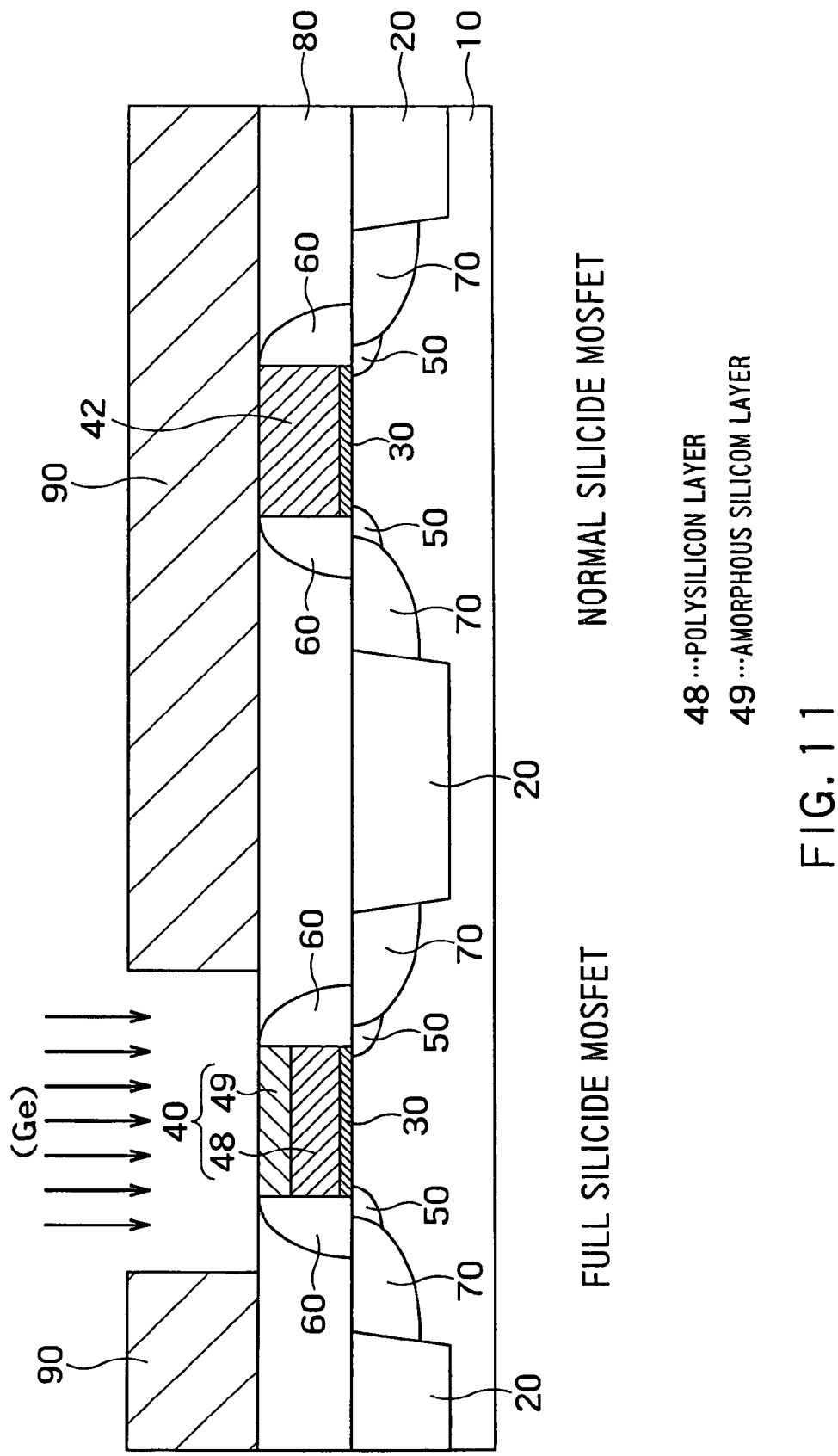
FIG. 11 is a cross-sectional diagram showing a method of manufacturing a semiconductor device according to a third embodiment of the present invention.
Figure 12:
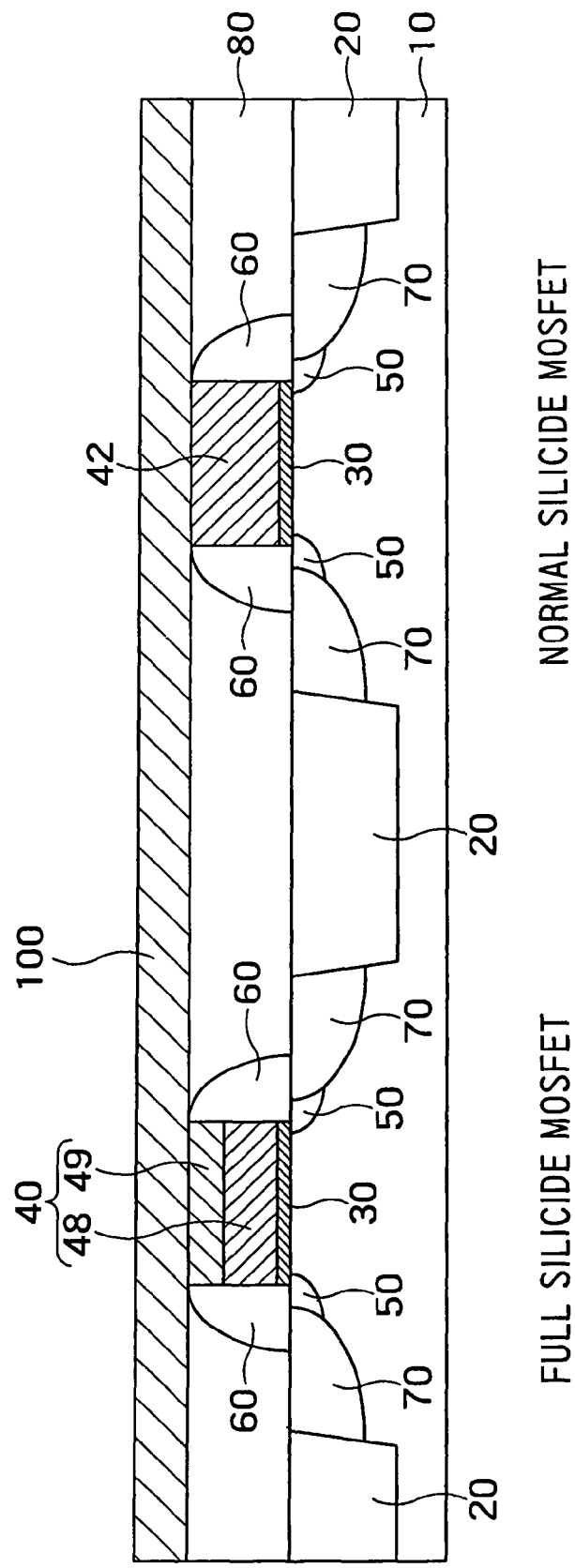
FIG. 12 is a cross-sectional diagram showing a method of manufacturing a semiconductor device following FIG. 11.
Figure 13:
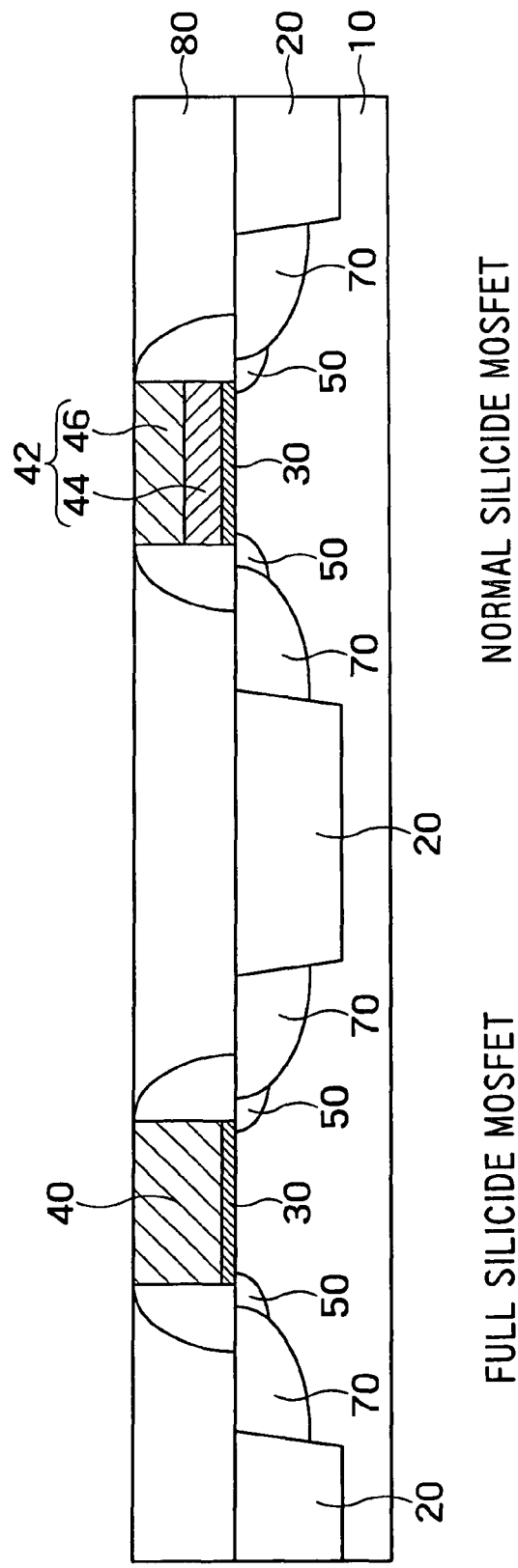
FIG. 13 is a cross-sectional diagram showing a method of manufacturing a semiconductor device following FIG. 12.

FIG. 11 to FIG. 13 are cross-sectional diagrams showing a flow of a method of manufacturing a semiconductor device according to a third embodiment of the present invention. First, the configuration as shown in FIG. 1 is obtained in a process similar to that according to the first embodiment. Next, the photoresist 90 is coated as a mask material on the first and the second gate electrodes 40 and 42, respectively. As shown in FIG. 11, the photoresist 90 is patterned to expose the upper surface of the first gate electrode 40 while keeping the second gate electrode 42 covered with the photoresist 90. Germanium ions or silicon ions are implanted into the first gate electrode 40 using the photoresist 90 as a mask. As a result, polysilicon on the upper part of the first gate electrode 40 becomes amorphous silicon. With this arrangement, the first gate electrode 40 has a two-layer configuration including the amorphous silicon layer 49 and a polysilicon layer 48.

After the photoresist 90 is removed, the nickel film 100 is deposited as a metal film, as shown in FIG. 12. The first and the second gate electrodes 40 and 42 are reacted with the nickel film 100 in an annealing process, thereby forming nickel silicide as a gate electrode, as shown in FIG. 13. In this process, in the first gate electrode 40, the amorphous silicon layer 49 and the polysilicon layer 48 are fully silicided. On the other hand, only the upper part of the second gate electrode 42 is silicided, and the second gate electrode 42 has a two-layer configuration including the silicide layer 46 and the polysilicon layer 44. This is because amorphous silicon is more easily silicided than polysilicon. Therefore, at the time when the first gate electrode 40 is fully silicided, the second gate electrode 42 is not yet fully silicided. Accordingly, heat processing is stopped after the first gate electrode 40 is fully silicided and before the second gate electrode 42 is fully silicided. Thereafter, a semiconductor device is completed in a process similar to that according to the first embodiment. According to the third embodiment, effect similar to that by the first embodiment is obtained.

(Modification of the Third Embodiment)

According to a modification of the third embodiment, a silicide layer (not shown) can be formed on the source/drain layer 70 (refer to FIG. 5). In this case, the first and the second gate electrodes 40 and 42 are covered with a mask material, and the silicide layer 110 is formed on the source/drain layer 70. After that, the inter-layer insulation film 80 is flattened to expose the upper surfaces of the first and the second gate electrodes 40 and 42, and germanium or silicon ion is implanted into the first gate electrodes 40.

Fourth Embodiment

Figure 14:
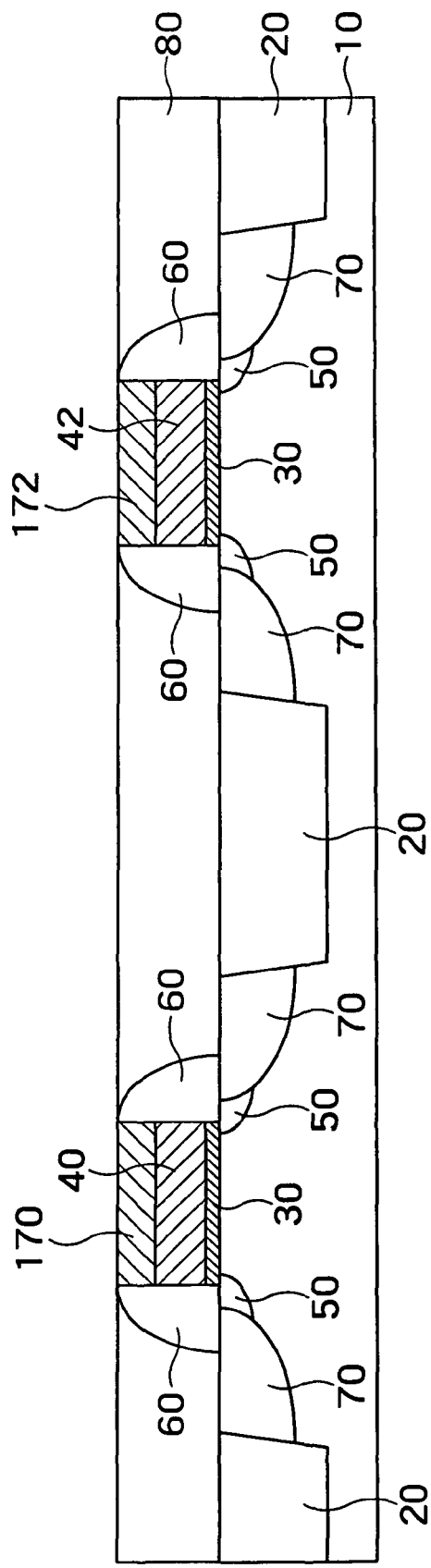
FIG. 14 is a cross-sectional diagram showing a method of manufacturing a semiconductor device according to a fourth embodiment of the present invention.

FIG. 14 to FIG. 17 are cross-sectional diagrams showing a flow of a method of manufacturing a semiconductor device according to a fourth embodiment of the present invention. First, the gate insulation film 30 is formed on the silicon substrate 10 in a process similar to that according to the first embodiment. Next, polysilicon and silicon nitride films are deposited on the gate insulation film 30. The polysilicon film and the silicon nitride film are formed in a gate pattern using a photolithographic technique and anisotropic etching such as RIE. As a result, the first and the second gate electrodes 40 and 42 and silicon nitride film caps 170 and 172 are formed, as shown in FIG. 14. The silicon nitride film caps 170 and 172 cover the upper surfaces of the first and the second gate electrodes 40 and 42, respectively as silicidation restricting materials.

Figure 15:
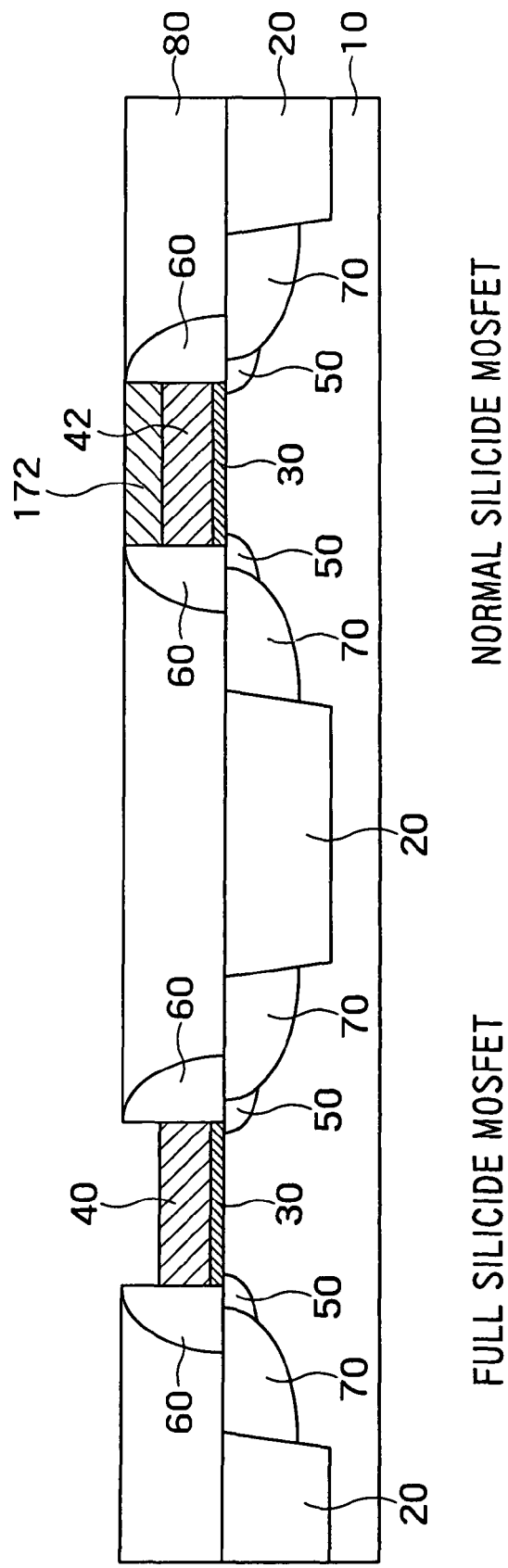
FIG. 15 is a cross-sectional diagram showing a method of manufacturing a semiconductor device following FIG. 14.

A photoresist (not shown) is coated on the silicon nitride film caps 170 and 172. The photoresist is patterned so that the silicon nitride film cap 172 on the second gate electrode 42 is covered and the upper surface of the silicon nitride film cap 170 on the first gate electrode 40 is exposed. The silicon nitride film cap 170 is removed using this photoresist as a mask. After the photoresist is removed, a configuration as shown in FIG. 15 is obtained.

Figure 16:
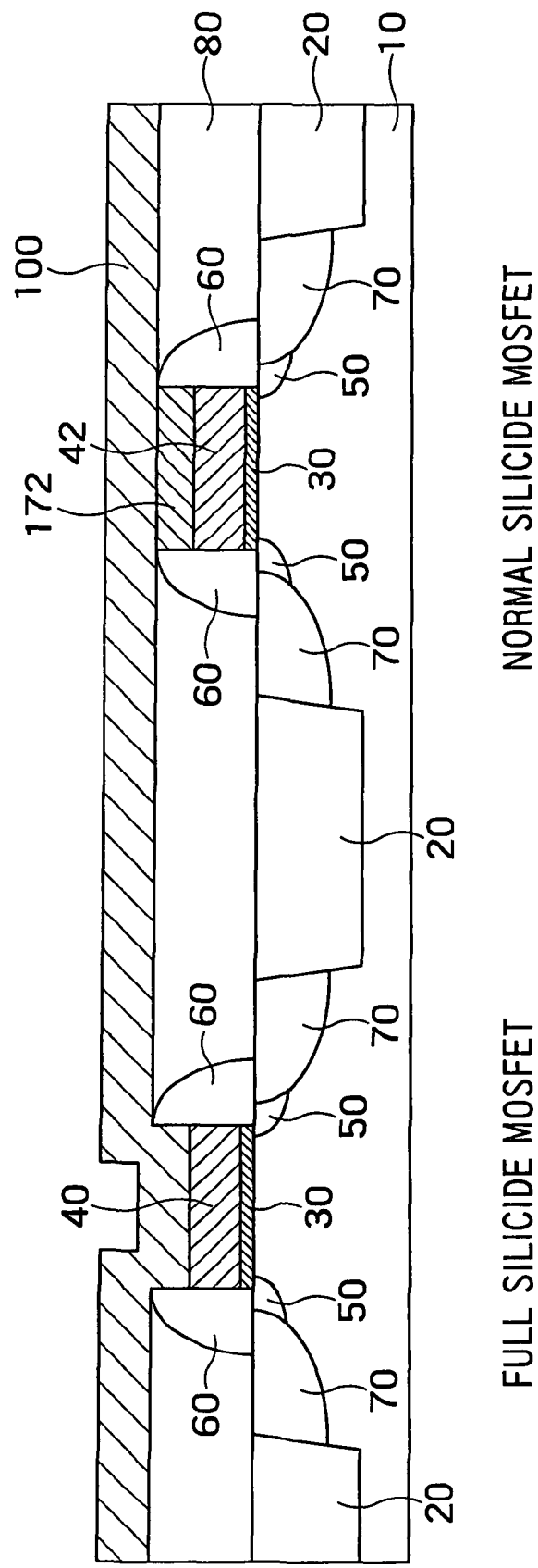
FIG. 16 is a cross-sectional diagram showing a method of manufacturing a semiconductor device following FIG. 15.
Figure 17:
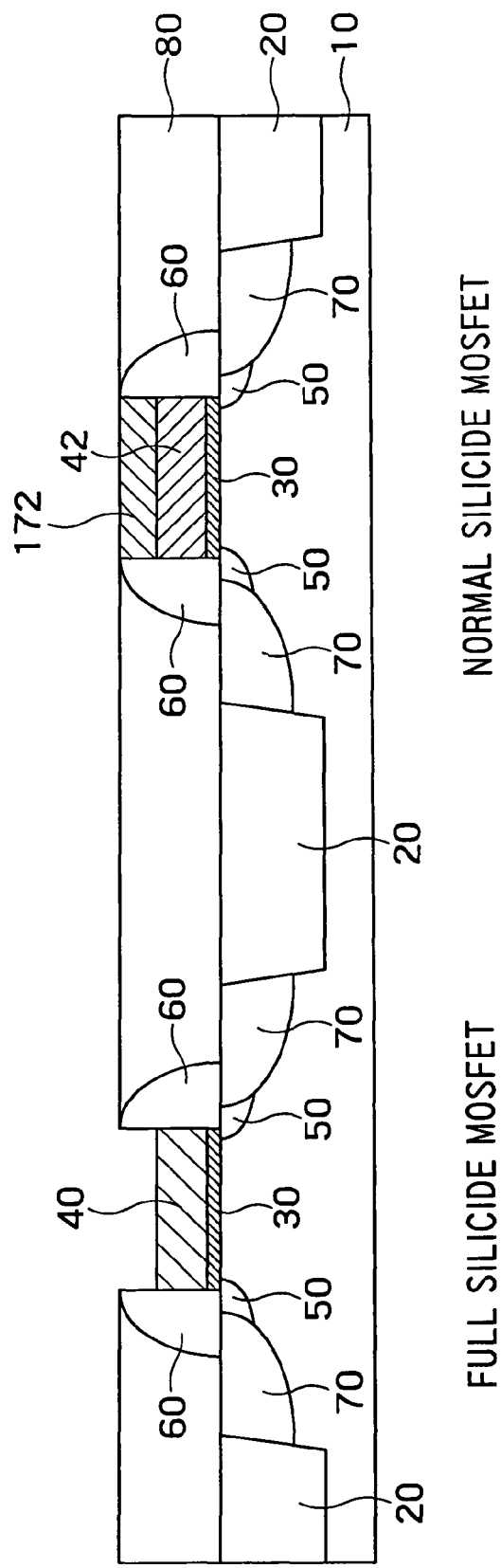
FIG. 17 is a cross-sectional diagram showing a method of manufacturing a semiconductor device following FIG. 16.

As shown in FIG. 16, the nickel film 100 is deposited as a metal film. The first gate electrode 40 is reacted with the nickel film 100 in an annealing process, thereby forming nickel silicide as a gate electrode, as shown in FIG. 17. In this process, the first gate electrode 40 is fully silicided. On the other hand, the second gate electrode 42 is not silicided. This is because the silicon nitride film cap 172 is less easily silicided than polysilicon, and silicidation does not progress to the second gate electrode 42.

In a case that a silicide is formed on the upper surface of the second gate electrode 42 to lower the gate resistance of the second gate electrode 42, it is necessary to remove the silicon nitride film cap 172 and to form a film of nickel again on the upper surface of the second gate electrode 42 and to anneal the film.

Fifth Embodiment

Figure 18:
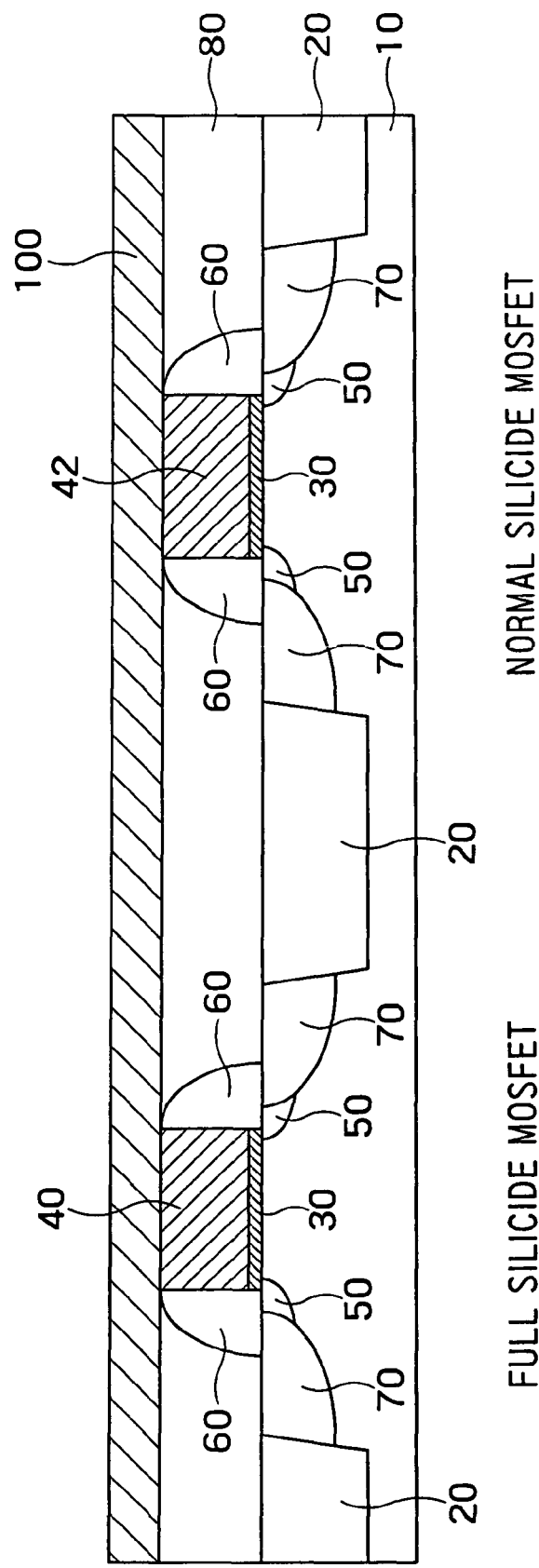
FIG. 18 is a cross-sectional diagram showing a method of manufacturing a semiconductor device according to a fifth embodiment of the present invention.
Figure 19:
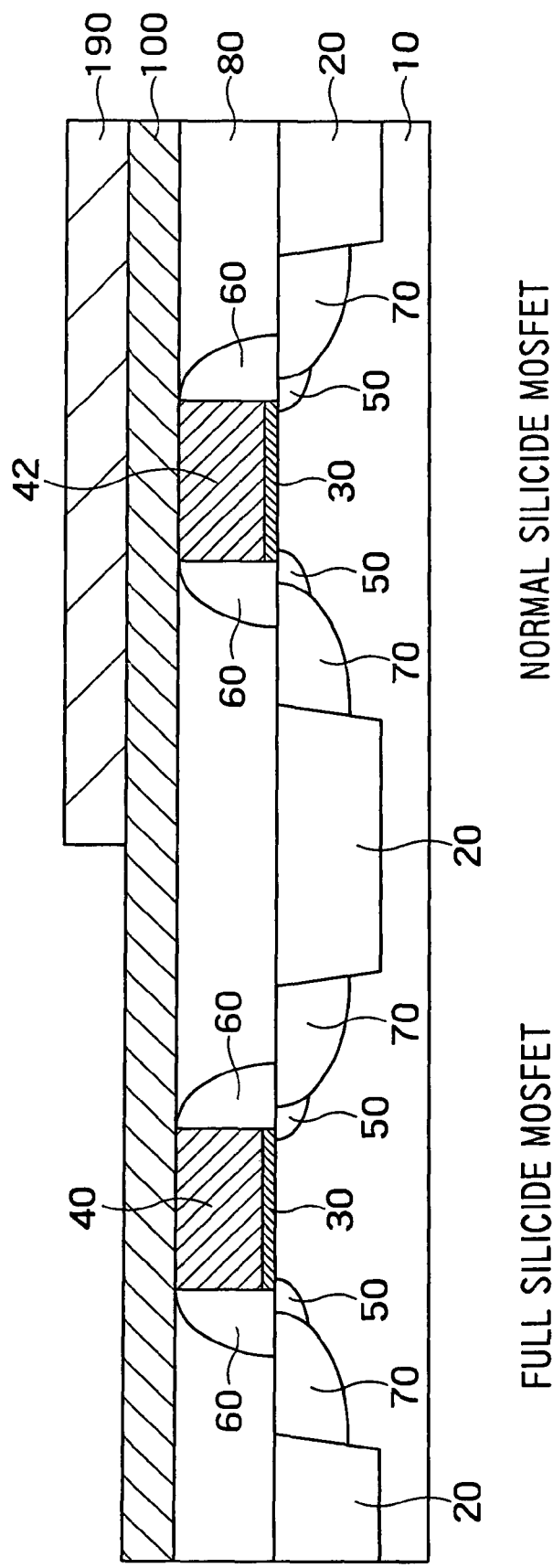
FIG. 19 is a cross-sectional diagram showing a method of manufacturing a semiconductor device following FIG. 18.
Figure 20:
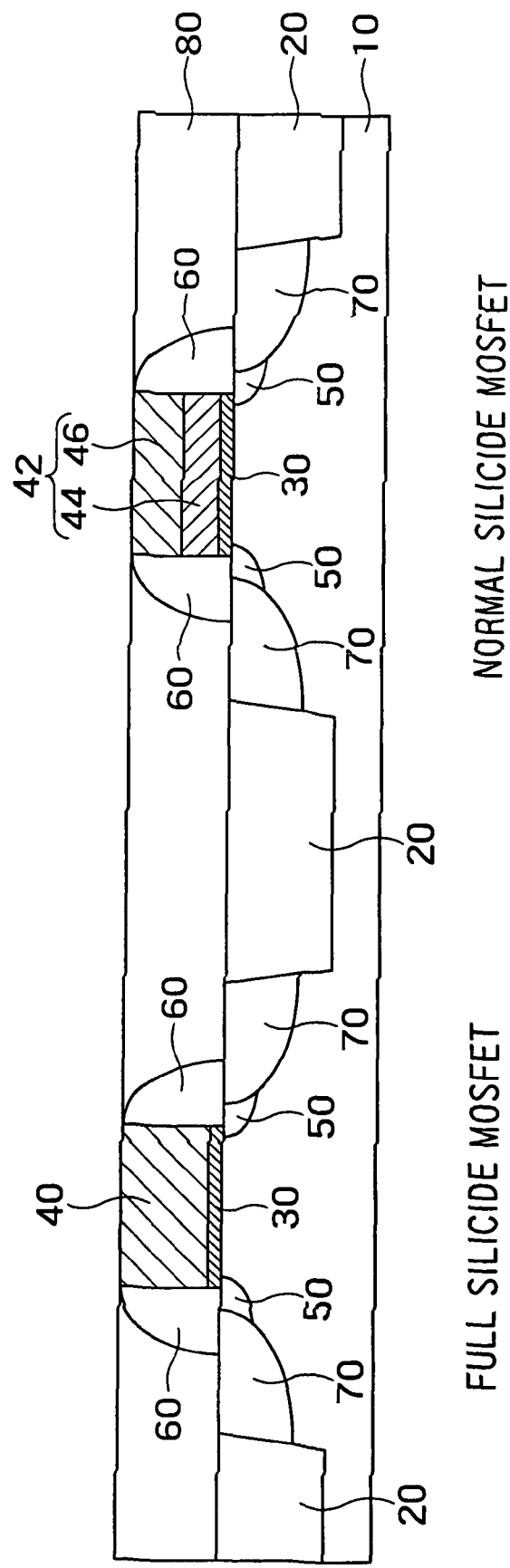
FIG. 20 is a cross-sectional diagram showing a method of manufacturing a semiconductor device following FIG. 19.

FIG. 18 to FIG. 20 are cross-sectional diagrams showing a flow of a method of manufacturing a semiconductor device according to a fifth embodiment of the present invention. First, the configuration as shown in FIG. 1 is obtained in a process similar to that according to the first embodiment. Next, the nickel film 100 is deposited as a metal film, as shown in FIG. 18.

Next, as shown in FIG. 19, a titanium nitride film 190, for example, is deposited as a heat shielding film. The titanium nitride film 190 is patterned to cover the nickel film 100 on the second gate electrode 42 and to expose the nickel film 100 on the first gate electrode 40 using a photolithographic technique and wet etching.

The first and the second gate electrodes 40 and 42 are, subsequently, reacted with the nickel film 100 in an annealing process, thereby forming nickel silicide as a gate electrode, as shown in FIG. 20. I this silicidation process, it is preferred that a lamp heating apparatus or a light heating apparatus is used to facilitate the controlling of the silicidation. In this process, only the upper part of the second gate electrode 42 is silicided, and the lower part of the second gate electrode 42 is not silicided. This is because the silicidation of the second gate electrode 42 is restricted due to the shielding of heat by the titanium nitride film 190. On the other hand, since the titanium nitride film 190 is not present on the first gate electrode 40, the first gate electrode 40 is fully silicided.

The titanium nitride film 190 is removed next. Preferably, the nickel film 100 and the titanium nitride film 190 that remain are also removed at the same time. The nickel film 100 and the titanium nitride film 190 can be removed by treating them (SH process) using hydrogen peroxide solution and sulfuric acid solution, for example. Thereafter, a semiconductor device is completed in a process similar to that according to the first embodiment. The semiconductor device according to the fifth embodiment has effect similar to that by the first embodiment.

The heat shielding film 190 is not limited to titanium nitride, and preferably does not react with the metal film 100 (nickel, for example). This is because if the heat shielding film 190 reacts with the metal film 100, the metal film 100 is corroded. Preferably, the heat shielding film 190 is made of a material that is dissolved in hydrogen peroxide solution and sulfuric acid solution. This is because the metal film 100 and the heat shielding film 190 can be removed through the same process after silicide is formed.

Sixth Embodiment

Figure 21:
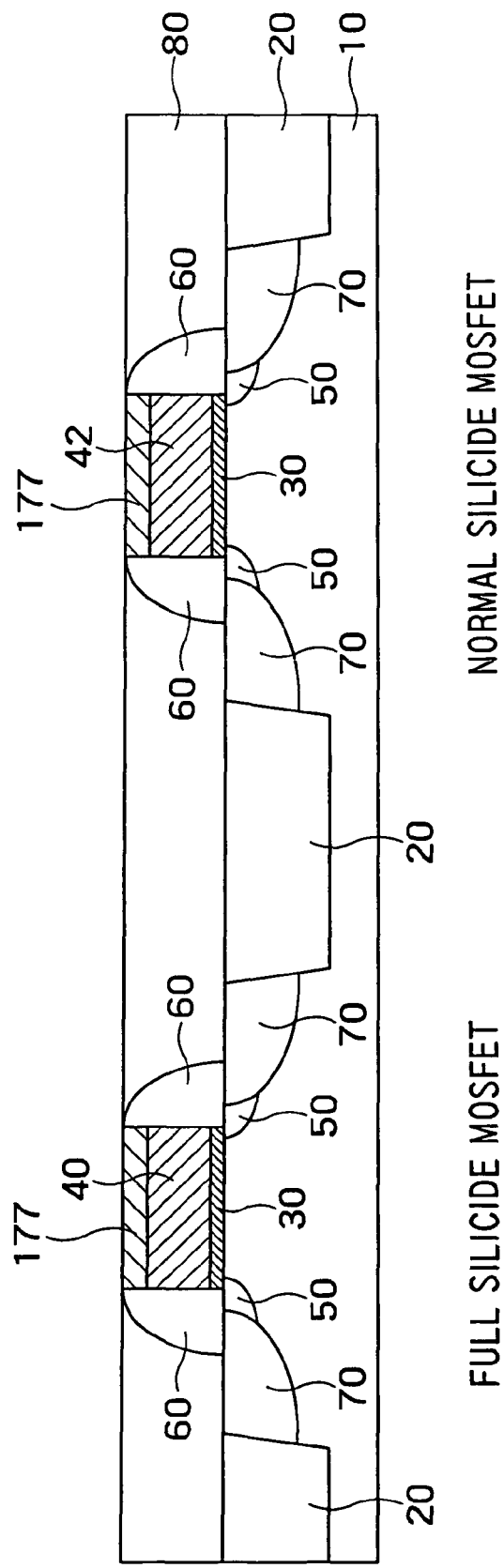
FIG. 21 is a cross-sectional diagram showing a method of manufacturing a semiconductor device according to a sixth embodiment of the present invention.

FIG. 21 to FIG. 26 are cross-sectional diagrams showing a flow of a method of manufacturing a semiconductor device according to a sixth embodiment of the present invention. First, the gate insulation film 30 is formed on the silicon substrate 10 in a process similar to that according to the first embodiment. Next, polysilicon and silicon nitride films are deposited on the gate insulation film 30. The polysilicon film and the silicon nitride film are formed in a gate pattern using a photolithographic technique and anisotropic etching such as RIE. As a result, the first and the second gate electrodes 40 and 42 and silicon nitride film caps 177 are formed, as shown in FIG. 21. The silicon nitride film caps 177 cover the upper surfaces of the first and the second gate electrodes 40 and 42, respectively.

Figure 22:
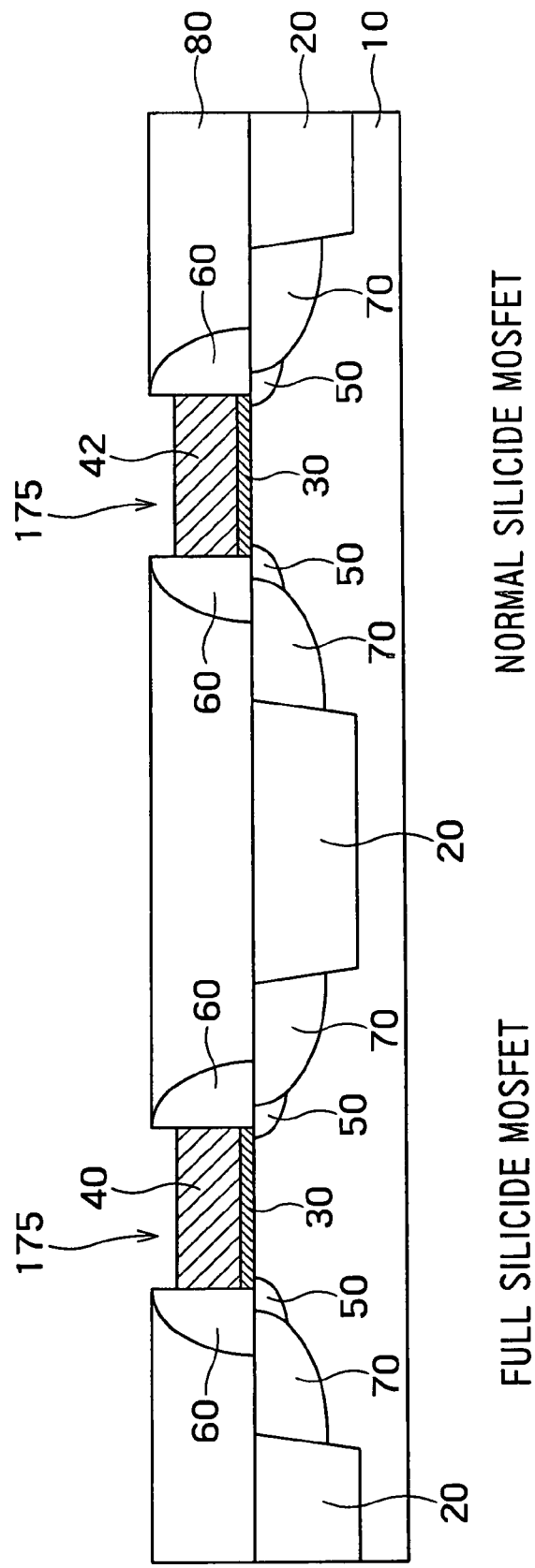
FIG. 22 is a cross-sectional diagram showing a method of manufacturing a semiconductor device following FIG. 21.

Next, as shown in FIG. 22, the silicon nitride film caps 177 are etched using thermal phosphoric solution or RIE. As a result, trenches 175 are formed at positions where the silicon nitride film caps 177 were present.

Figure 23:
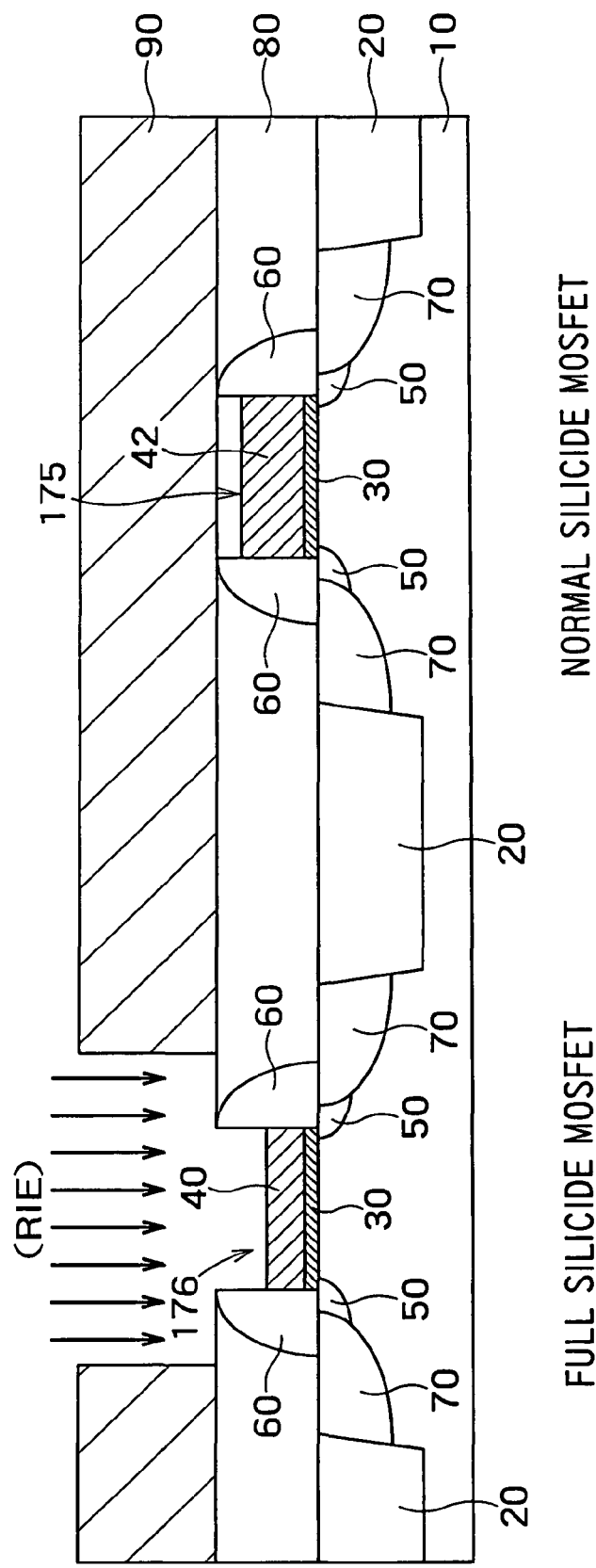
FIG. 23 is a cross-sectional diagram showing a method of manufacturing a semiconductor device following FIG. 22.

The photoresist 90 is coated as a mask material on the first and the second gate electrodes 40 and 42, respectively. As shown in FIG. 23, the photoresist 90 is patterned to expose the upper surface of the first gate electrode 40 while keeping the second gate electrode 42 covered with the photoresist 90. The first gate electrode 40 is etched according to RIE or the like by using the photoresist 90 as a mask. As a result, the thickness of the first gate electrode 40 becomes smaller than that of the second gate electrode 42. For example, the thickness of the first gate electrode 40 is 50 nm to 70 nm, and the thickness of the second gate electrode 42 is 100 nm. Reference numeral 176 denotes a trench on the first gate electrode 40, and reference numeral 177 denotes a trench on the second gate electrode 42.

Figure 24:
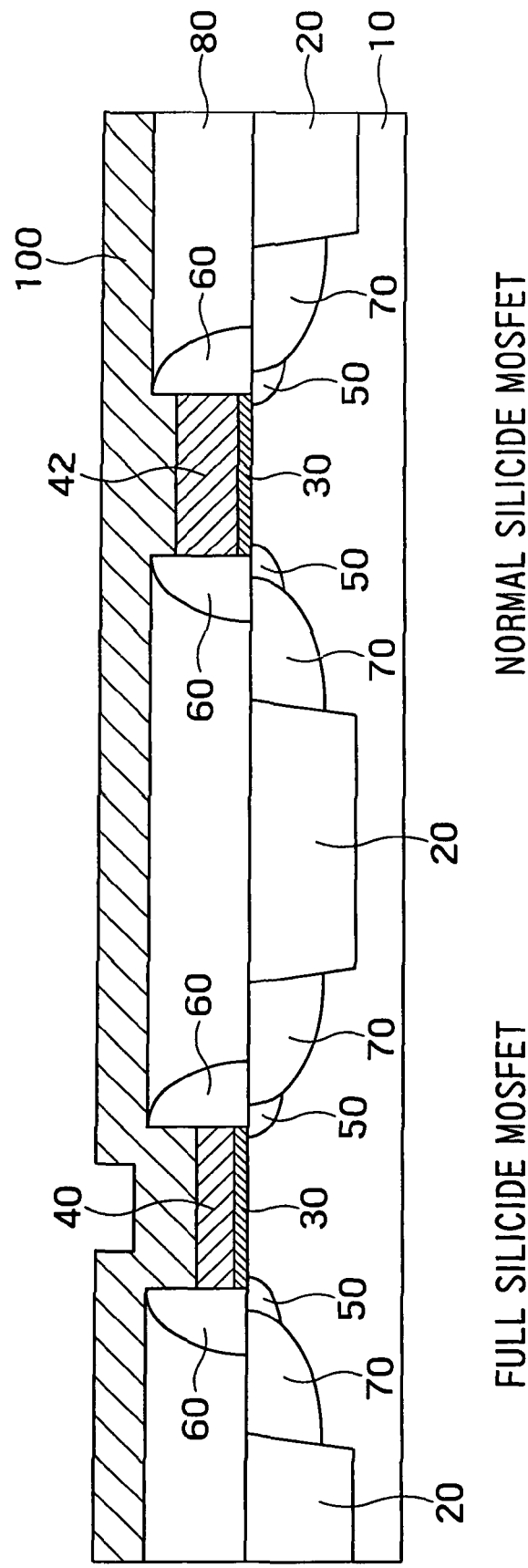
FIG. 24 is a cross-sectional diagram showing a method of manufacturing a semiconductor device following FIG. 23.

The photoresist 90 is removed, and the surface is pre-cleaned. Next, as shown in FIG. 24, a nickel film 100 is deposited as a metal film.

Figure 25:
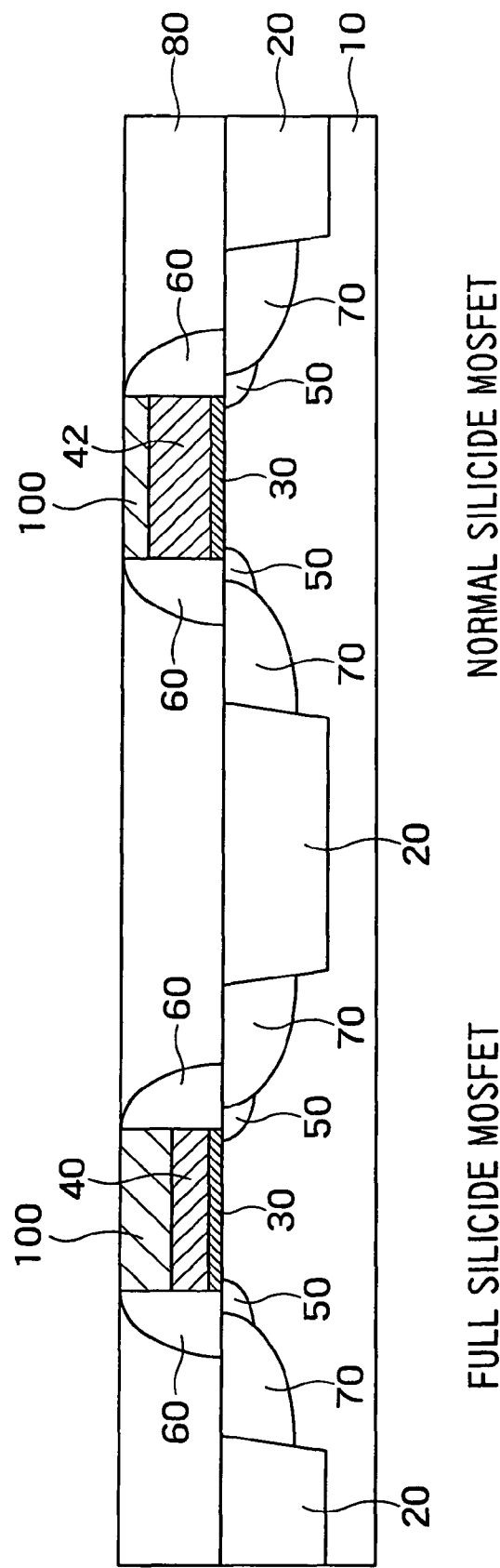
FIG. 25 is a cross-sectional diagram showing a method of manufacturing a semiconductor device following FIG. 24.

As shown in FIG. 25, the nickel film 100 is flattened by using CMP. As a result, the nickel film 100 that is present at the outside of the trenches 175 and 176 is removed, and the nickel film 100 within the trenches 175 and 176 remains. The first and the second gate electrodes 40 and 42 are reacted with the nickel film 100 in an annealing process, thereby forming nickel silicide as a gate electrode. The quantity of the nickel film 100 within the trench 176 needs to be sufficient enough to silicide the first gate electrode 40. On the other hand, the quantity of the nickel film 100 within the trench 175 is at a level that only the upper part of the second gate electrode 42 is silicided and the polysilicon layer 44 remains at a lower part of the second gate electrode 42.

According to the present embodiment, nickel is not supplied from the surrounding of the first and the second gate electrodes 40 and 42. Therefore, a ratio of the quantity of polysilicon to the quantity of nickel of the nickel film 100 is constant regardless of a gate pattern in the first and the second gate electrodes 40 and 42, respectively. In order to change the ratio of the quantity of polysilicon to the quantity of nickel of the nickel film, the thickness of the silicon nitride film cap 177 shown in FIG. 21 and the etching quantity of RIE shown in FIG. 23 are changed. In other words, when the thickness of the silicon nitride film cap 177 and the etching quantity of the first gate electrode 40 are controlled, a ratio of the quantity of polysilicon to the quantity of nickel of the nickel film can be determined. As a result, the second gate electrode 42 can be partially silicided and the first gate electrode 40 can be fully silicided.

Figure 26:
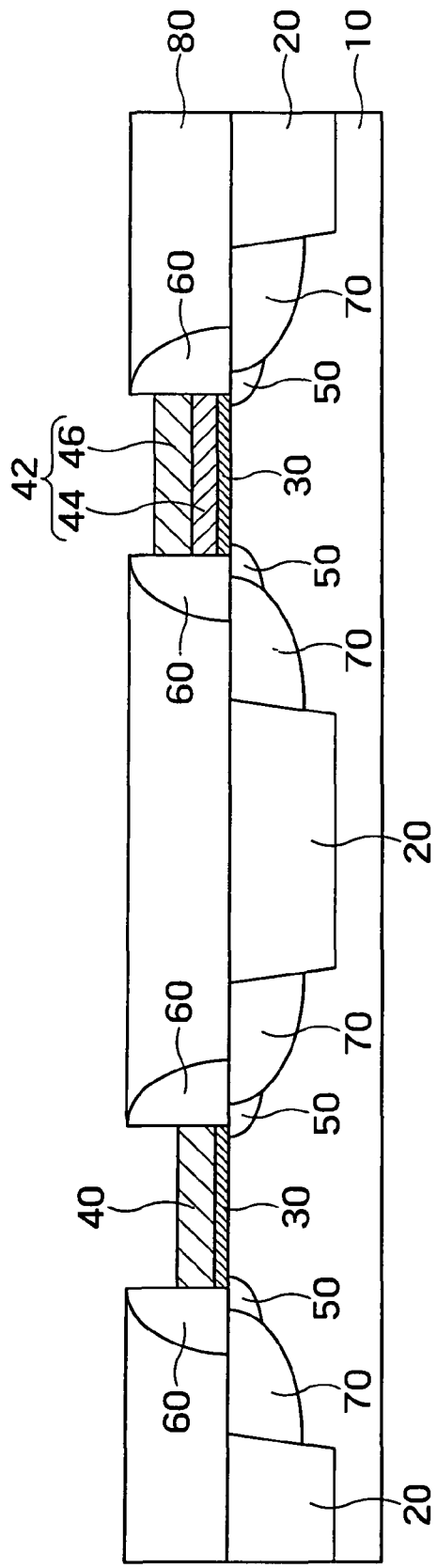
FIG. 26 is a cross-sectional diagram showing a method of manufacturing a semiconductor device following FIG. 25.

A configuration as shown in FIG. 26 is obtained through the above process. The subsequent manufacturing process is similar to that according to the first embodiment. As a result, a semiconductor device is completed. The semiconductor device according to the sixth embodiment has effect similar to that according to the first embodiment.

In the first to the sixth embodiments, in order to control the threshold voltage of transistors, impurities may be introduced into polysilicon that becomes a material of the first and the second gate electrodes, before the polysilicon is formed in a gate pattern.

The material of the first and the second gate electrodes may be amorphous silicon. However, according to the third embodiment, the material of the first and the second gate electrodes needs to be polysilicon.

The metal film 100 is not limited to nickel, and can be titanium (Ti), cobalt (Co), platinum (Pt), tungsten (W), erbium (Er), or yttrium (Y), for example.

The gate insulation film 30 can be a high dielectric, an oxide film, or an oxinitride film that is different from the materials explained above. Gate insulation films having different thicknesses can be formed in a full silicide region or other regions according to a known method. For example, a thin (equal to or smaller than 3 nm, for example) gate insulation film may be formed in a core circuit region where a full silicide MOSFET is formed, and a thick (equal to or larger than 3 nm, for example) gate insulation film may be formed in a peripheral circuit region where a normal silicide MOSFET is formed.

As a modification of the second to the sixth embodiments, an SOI substrate and a partial SOI substrate may be employed for a semiconductor substrate, like in the modifications of the first embodiment shown in FIG. 6 and FIG. 7.

In the process of flattening the inter-layer insulation film 80, etching according to CMP can be stopped in a state that the silicon oxide film slightly remains on the upper surface of the first and the second gate electrodes 40 and 42, and the rest of the silicon oxide film can be removed by etching such as RIE.

While the above embodiments are applied to a plane transistor, the embodiments can be also applied to transistors in which channels and gate electrodes are in a three-dimensional configuration such as fin-type transistors.

The invention claimed is:

1. A method of manufacturing a semiconductor device comprising:
    forming a gate insulation film on a semiconductor substrate;
    forming a first gate electrode and a second gate electrode on the gate insulation film;
    forming a mask material so as to expose an upper surface of the second gate electrode while keeping the first gate electrode covered;
    forming a silicidation restricting layer inside the second gate electrode, the silicidation restricting layer being less easily silicided than a material of the first and the second gate electrodes;
    removing the mask material;
    depositing a metal film on the first gate electrode and the second gate electrode; and
    siliciding the whole of the first gate electrode and an upper part above the silicidation restricting layer in the second gate electrode.

2. The method of manufacturing a semiconductor device according to claim 1, wherein
    the silicidation restricting layer is formed by implanting nitrogen (N) into the second gate electrode.

3. The method of manufacturing a semiconductor device according to claim 1, wherein the first gate electrode is formed in a core circuit part and the second gate electrode is formed in a peripheral part.

4. The method of manufacturing a semiconductor device according to claim 2, wherein the first gate electrode is formed in a core circuit part and the second gate electrode is formed in a peripheral part.

5. The method of manufacturing a semiconductor device according to claim 1, wherein the silicidation restricting layer includes nitrogen.

6. The method of manufacturing a semiconductor device according to claim 3, wherein the silicidation restricting layer includes nitrogen.

7. The method of manufacturing a semiconductor device according to claim 1, wherein the metal layer includes one of a group of Ni, Ti, Co, Pt, W, Er and Y.

8. The method of manufacturing a semiconductor device according to claim 2, wherein the metal layer includes one of a group of Ni, Ti, Co, Pt, W, Er and Y.

9. The method of manufacturing a semiconductor device according to claim 3, wherein the metal layer includes one of a group of Ni, Ti, Co, Pt, W, Er and Y.

10. The method of manufacturing a semiconductor device according to claim 4, wherein the metal layer includes one of a group of Ni, Ti, Co, Pt, W, Er and Y.

11. The method of manufacturing a semiconductor device according to claim 5, wherein the metal layer includes one of a group of Ni, Ti, Co, Pt, W, Er and Y.

12. The method of manufacturing a semiconductor device according to claim 6, wherein the metal layer includes one of a group of Ni, Ti, Co, Pt, W, Er and Y.

* * * * *